United States Patent [19]

Olney, Jr. et al.

[11] 4,009,683
[45] Mar. 1, 1977

[54] APERTURE SEALING DEVICE FOR FILM LEAD FABRICATION

[75] Inventors: Frederick D. Olney, Jr.; Dennis E. Rich, both of Phoenix, Ariz.

[73] Assignee: Honeywell Information Systems, Inc., Phoenix, Ariz.

[22] Filed: Dec. 12, 1975

[21] Appl. No.: 640,128

[52] U.S. Cl. .............................................. 118/266
[51] Int. Cl.² ......................................... B05C 1/06
[58] Field of Search .......... 118/266, 410, 411, 610; 401/176, 196, 265, 180, 198

[56] References Cited

UNITED STATES PATENTS

| | | | |
|---|---|---|---|
| 1,296,107 | 3/1919 | Oakley | 401/176 |
| 1,937,006 | 11/1933 | Aronson | 401/176 |
| 1,957,545 | 5/1934 | Krueger et al. | 401/265 X |
| 2,666,416 | 1/1954 | Rickmeyer | 401/198 X |
| 3,152,011 | 10/1964 | Gerard | 118/266 X |
| 3,420,208 | 1/1969 | Guthrie | 118/2 |
| 3,467,478 | 9/1969 | Webber | 401/265 X |

Primary Examiner—John P. McIntosh
Attorney, Agent, or Firm—J. Stanley Edwards; William W. Holloway, Jr.; Ronald T. Reiling

[57] ABSTRACT

A positive pressure apparatus for depositing a thin, even layer of an adhering liquid material to seal openings on a metallic clad film-type carrier is disclosed. The openings, on the film side opposite the metallic lamination, are covered prior to the etching process in order to minimize undercutting by the etching material on the metallic lamination and to provide support for the resulting integrated circuit leads. The apparatus uses a positive pressure mechanism to force the fluid material through a porous ceramic element in order to obtain uniform flow.

3 Claims, 4 Drawing Figures

APERTURE SEALING DEVICE FOR FILM LEAD FABRICATION

BACKGROUND OF THE INVENTION

1. Field of the Invention

This invention relates to semiconductor devices, and more specifically to integrated circuits, hereinafter referred to as chips, and the process in which electrical connections for their use are formed on a thin metallic layer attached to a flexible insulating strip, hereinafter referred to as film.

2. Description of the Prior Art

In the production of semiconductor devices processes have been developed to permit mass production of the electrical connections (leads) necessary for their use, see U.S. Pat. No. 3,440,027 issued Apr. 22, 1969. Presently the two major processes (wet film and dry film) both involve the use of a flexible insulating strip that is clad with a thin metallic layer on one side. The metal, usually a thin strip of copper, is prepared to allow a photographic process to imprint the integrated circuit lead pattern desired (positive photographic method) or a pattern excluding the integrated circuit lead pattern desired (negative photographic method) on the treated metallic surface. The imprinted pattern is then developed and the metallic surface subjected to an etching material to etch away all the metal in the strip except for the desired beam lead pattern, see U.S. Pat. No. 3,777,365 issued Dec. 11, 1973.

The leads generally converge towards the center of the metallic layer opposite which is usually an aperture through the strip to facilitate bonding of the chip to the leads. This aperture, called a personalty window, must be sealed prior to application of the etching material in order to prevent undercutting of the leads by the etching agent, and at the same time can support the leads until just prior to bonding of the chips. Undercutting, as used in a method of chip lead fabrication utilizing an etching process, denotes action by the etching material on the individual leads causing the leads to lack a uniform cross-sectional area from the side of the metallic strip which was imprinted to the side adjacent to the insulating strip.

Preparation of wet film for the photographic process is a slow and labor consuming operation requiring precise control of ambient conditions. The dry film process on the other hand is inherently much faster but the cost of preparing the film for the lead fabrication is more costly. Both wet and dry film processes for fabricating chip lead patterns normally use film with precut apertures in the insulating strip. It is possible, however, to assemble chips to their lead structures without prior cutting of the aperture in the insulating strip or by etching an aperture in the film after the lead pattern has been fabricated.

At present the apertures are sealed by a fluid applied by either a spray or roller application or by dripping drops of fluid onto the back side of the metallic strip. Problems are encountered, however, when the process is sped up as an uneven coat or lack of complete aperture seal may occur. An uneven coat causes problems in the developing process which may require that the fluid be applied only after the imprinted pattern has been developed. This additional handling process occurs at a critical time in the overall process since small scratches on the metallic surface can ruin the entire lead pattern.

In general it is an object of the present invention to provide a device to overcome the above named disadvantages in the fabrication of electrical connections for integrated circuits.

Another object of the invention is to cover the aperture in the insulating strip to prevent undercutting during the etching process.

Another object of the invention is to speed up the aperture sealing process.

Another object of the invention is to reduce the number of different steps used in processing the film.

Another object of the invention is to allow application of a more uniform layer of sealing material to the insulating strip.

These and other objects of the invention will become apparent to one of ordinary skill in the art when viewed in light of the detailed drawings and their description.

SUMMARY OF THE INVENTION

This invention comprises a device to speed up the production of lead patterns for integrated circuits and represents a substantial improvement over the prior art in applying a uniform seal over apertures precut in film used in that process.

The device comprises positive pressure means to force the liquid coating material through filtration means which causes an even, uniform flow of the liquid over the entire cross-sectional area of the orifice of the distribution means. An adjustment valve controls the amount of fluid per unit time reaching the orifice and thereby determines the thickness of the application for each speed of film travel under the orifice.

The device may also embody fluid material input means that allows application of the fluid without prior exposure to the ambient environment. In addition, a pressure regulator device capable of shutting off the applied pressure may be utilized so that the fluid is only applied when the aperture is beneath the orifice.

DETAILED DESCRIPTION OF THE INVENTION

Figure 1:
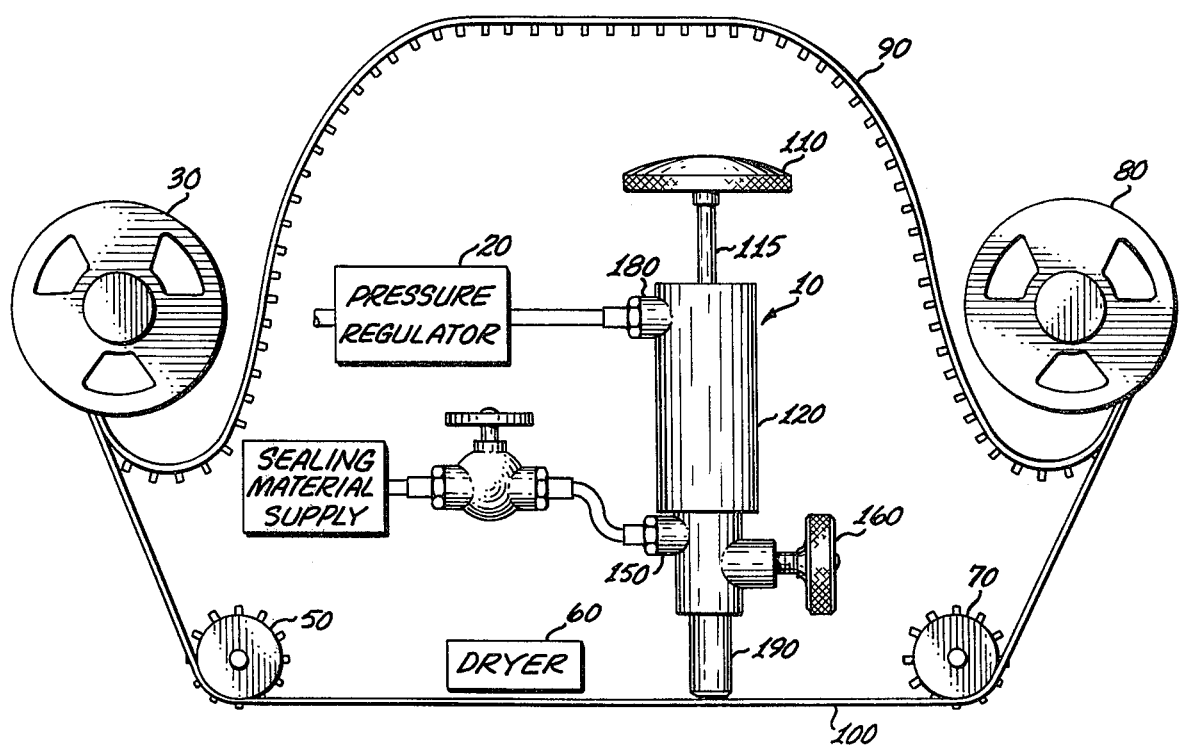
FIG. 1 is a schematic view of a preferred embodiment of the aperture sealing device for film lead fabrication, showing supply and take-up reels as well as optional devices for use in combination with essential elements of the invention.
Figure 3:
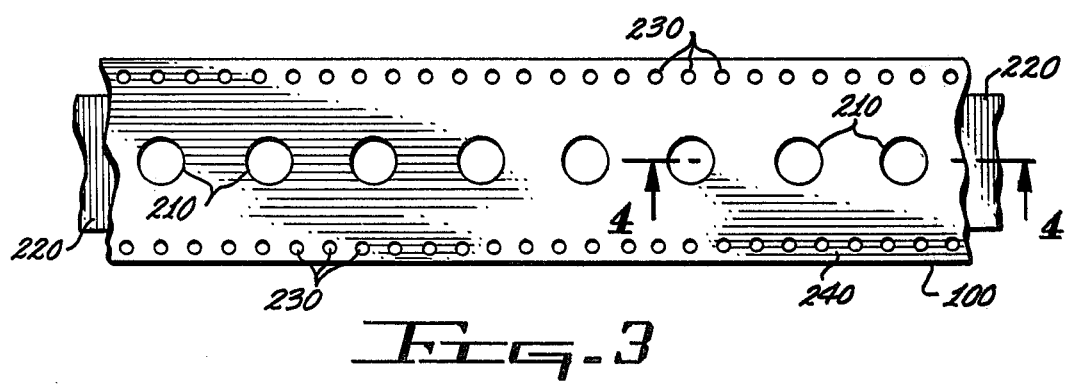
FIG. 3 is a top view of the preferred embodiment of the film, to be used with the invention.

In FIG. 1 the metallic clad film 100, described in detail in FIG. 3, is shown being unwound from a supply reel 80. The film 100, is aligned under the aperture sealing device by guide sprocket 70 and film drive 50. The device 10 should be orientated as shown to prevent the sealing material from seeping out of the apertures in the film and creating an uneven, nonuniform distribution of sealant on the film. The use of the optional pressure regulator 20 allows a noncontinuous flow of sealing material from the device 10 onto the film 100 resulting in a net saving of sealing material by applying the material on the film only when the apertures are positioned under the aperture sealing device.

The sealing material may be air-dried after the application while the film is being wound up on take-up reel 30. The take-up reel, powered by a slip clutch mechanism, in conjunction with the film drive 50, a variable speed device, permits setting the desired speed of film travel under device 10. For ease of alignment and to prevent skewing of the film take-up reel 30, film drive 50, the device 10, guide sprocket 70, and supply reel 80 should all lie in the same vertical plane.

For applications requiring high application rates in environments that do not allow large separation between the take-up reel 30 and the device 10 for air-drying, an optional drying device 60, such as an infrared lamp, may be used to hasten the drying process. In addition, an optional spacing strip 90, positioned by appropriate guides may be utilized to prevent contact between the sealing material applied to the film and its metal clad surface.

Figure 2:
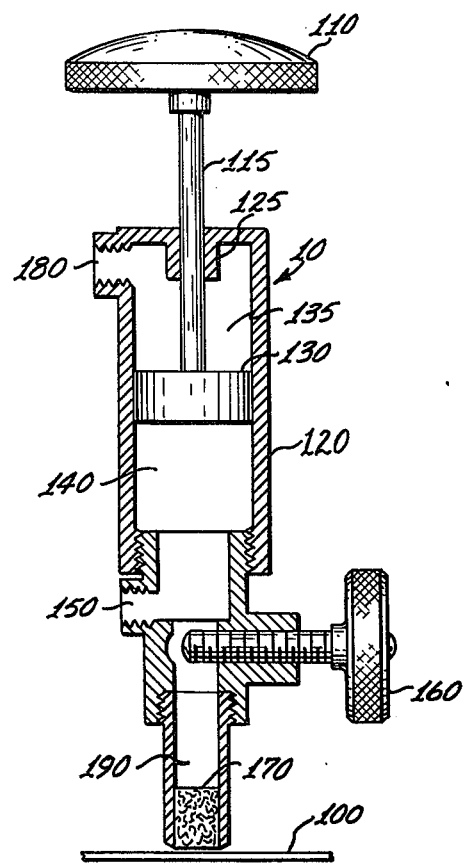
FIG. 2 is a side view of the aperture sealing device picturing the interior parts.

FIG. 2, depicting the aperture sealing device of FIG. 1 in greater detail, shows that the device 10 consists of a hollow cylinder 120, at the top of which is a sealed opening to permit movement of the shaft 115 of filler handle 110 up and down the longitudinal axis of cylinder 120. Connected to the lower end of shaft 115 is a plunger 130, which divides the cylinder into two sections, pressure reservoir 135 and fluid reservoir 140. Connected to or a part of the lower portion of the fluid reservoir 140 is flow channel 190 which provides a passageway from the reservoir to the filter 170 and into which is an opening, suction fill port 150, for the insertion of the sealing material. Another opening in the flow channel 190 allows insertion of the flow adjustment valve 160. The depth of penetration of the flow adjustment valve 160 into the flow channel 190 may be adjusted to vary the cross-sectional area of the flow channel. By varying the channel's cross-sectional area a variable rate of fluid flow through the channel is possible. At the bottom of channel 190 is element 170, which may be constructed of either a porous material such as ceramic or sintered metal or a nonporous material penetrated by extremely fine holes or slits. By so designing the element a uniform flow of sealing material to the surface of the film 100 is assured. Although shown as appended to cylinder 120 in FIGS. 1 and 2 the flow channel 190, flow adjustment valve 160 and suction fill port 170 can be integrated into the cylinder 120 if so desired. Stops 125 are inserted inside of cylinder 120 to prevent movement of the plunger 130 so as to block air port 180. The air port is used as an input mechanism for the compressed air used to operate the device.

FIG. 3 is a top view of a film 100 used for making integrated circuit leads. A thin metal strip 220, usually copper, is laminated to the flexible insulating strip 240. Indexing holes 230 shown as circular may be either square or rectangular depending upon the characteristics of the peripheral devices. The indexing holes allow alignment of the film under filter 170 of FIG. 2, as well as provide for engagement by the film drive for moving the film under the aperture sealing device.

Figure 4:
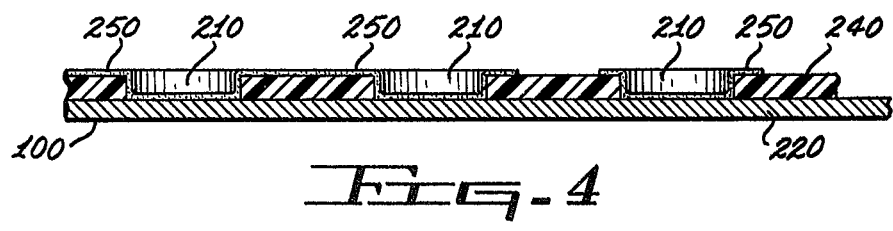
FIG. 4 is a cross-sectional view of FIG. 3 with the sealing material applied.

FIG. 4 is a longitudinal cross section of FIG. 3. The apertures 210 to the strip 240 are sealed by sealing material 250. The savings made possible by use of the optional pulsable pressure regulator is shown in FIG. 4.

A typical starting sequence for use of the device consists of first closing the flow adjustment valve, opening the suction fill port and pushing the filler handle and plunger downwards to void the fluid reservoir. A feed line to the sealing material is then attached to the suction fill port. A vacuum is created in the fluid reservoir by raising the filler handle and plunger. By acting through the flow channel, suction fill port and feed line to the sealing material the vacuum sucks the sealing material into the fluid reservoir. The fluid reservoir fills until further plunger travel is curtailed by the stops located inside the hollow cylinder. The feed line is then disconnected and the suction fill port closed. A pressurized air line is then connected to the air port. Compressed air, passing through the air port, exerts pressure on the plunger downward along the cylinder's longitudinal axis. If no compressed air is available a constant force may be applied downward on the filler handle to approximate the same results. By opening the flow adjust valve the pressurized sealing material is forced down the flow channel and through the element to the film passing underneath. In practice a element made of a porous ceramic compound or similar material or a nonporous filter with extremely fine holes or slits may be used. By adjustment of the fluid flow through the flow channel by varying the channel's cross-sectional area, i.e., by positioning of the flow adjustment valve, the proper thickness of sealing material may be applied to the film for any desired film speed.

To obtain maximum efficiency in the lead fabrication process it is desirable to use a sealing material that is soluble in the same solvent used to clean the leads of chemicals used in preparing the metallic surface for imprinting of the lead patterns. By so selecting the sealing material the film can be stripped of all the unwanted materials in one step, requiring only one solvent.

An even, uniform layer of sealing material is necessary to allow the photographic process to take place after the apertures are sealed. An uneven layer of sealant prevents the proper alignment of the photographic equipment with the treated metallic strip, consequently the resolution of the developed lead pattern is unacceptable.

Numerous modifications to the device may be made without departing from the present invention. The filling of the reservoir may be performed automatically by pressurizing the sealing material and forcing it into the reservoir or by evacuating the cylinder above the plunger through the air port. The flow adjust valve, although described herein as a manual adjustment, may also be automated by use of existing means. Other embodiments will be obvious to those skilled in the art without departing from the principles of this invention. The true spirit and scope of the invention is limited only by the appended claims.

What is claimed is:

1. An improved apparatus for sealing apertures in an insulating strip, said apparatus comprising:
   a. a hollow cylindrical body closed at one end and opened at the other end;
   b. a plunger mounted so as to move within the hollow cylinder, the diameter of the plunger equal to the inside diameter of the cylinder;
   c. a rod extending through the closed end of the cylinder and connected to the plunger, the opposite end of the rod being connected to a handle member;
   d. pressure input means located proximate to the closed end of the cylinder for applying positive pressure to one side of the plunger;

e. fluid input means located proximate to the open end of the cylinder for inserting a fluid into the cylinder body; and f. discharge means connected to the open end of the cylinder for directing and controlling fluid flow from the cylinder onto an insulating strip, the discharge means further comprising an outlet orifice terminated with a sintered metal element.

2. The apparatus as recited in claim 1, wherein the discharge means further comprises a manually operated valve for varying the cross-sectional area of the discharge means whereby fluid flow can be closely regulated.

3. An apparatus as defined in claim 1, wherein said pressure input means further comprises a pulsable pressure regulator capable of shutting off applied pressure, said pressure input means having a variable duty cycle.

* * * * *